United States Patent
Xie et al.

(10) Patent No.: US 9,628,077 B2
(45) Date of Patent: Apr. 18, 2017

(54) DUAL POWER SWING PIPELINE DESIGN WITH SEPARATION OF COMBINATIONAL AND SEQUENTIAL LOGICS

(71) Applicant: QUALCOMM Incorporated, San Diego, CA (US)

(72) Inventors: Jing Xie, San Diego, CA (US); Yang Du, Carlsbad, CA (US)

(73) Assignee: QUALCOMM Incorporated

( * ) Notice: Subject to any disclaimer, the term of this patent is extended or adjusted under 35 U.S.C. 154(b) by 0 days.

(21) Appl. No.: 14/638,270

(22) Filed: Mar. 4, 2015

(65) Prior Publication Data
US 2016/0261269 A1    Sep. 8, 2016

(51) Int. Cl.
| | |
|---|---|
| H03K 19/00 | (2006.01) |
| H03K 3/037 | (2006.01) |
| H03K 19/0175 | (2006.01) |
| H01L 25/065 | (2006.01) |
| G06F 1/32 | (2006.01) |

(52) U.S. Cl.
CPC ....... *H03K 19/0021* (2013.01); *G06F 1/3296* (2013.01); *H01L 25/0657* (2013.01); *H03K 3/037* (2013.01); *H03K 19/017509* (2013.01)

(58) Field of Classification Search
CPC .............. H03K 19/0021; H03K 3/037; H03K 19/017509
USPC ............... 326/46; 327/208–218; 712/232
See application file for complete search history.

(56) References Cited

U.S. PATENT DOCUMENTS

| | | | |
|---|---|---|---|
| 6,753,697 B2 | 6/2004 | Nakase | |
| 6,911,855 B2* | 6/2005 | Yin | H03K 3/356043 327/117 |
| 6,958,627 B2 | 10/2005 | Singh et al. | |
| 7,667,497 B2* | 2/2010 | Liang | H02J 1/10 326/33 |
| 8,421,499 B2 | 4/2013 | Takayanagi et al. | |
| 8,572,539 B2* | 10/2013 | Cortadella | H03K 19/20 327/142 |

(Continued)

OTHER PUBLICATIONS

International Search Report and Written Opinion—PCT/US2016/017084 ISA/EPO—Apr. 20, 2016.

(Continued)

*Primary Examiner* — Dylan White
(74) *Attorney, Agent, or Firm* — Muncy, Geissler, Olds & Lowe, P.C.

(57) ABSTRACT

A three-dimensional integrated circuit having a dual or multiple power domain is capable of less energy consumption operation under a given clock rate, which results in an enhanced power-performance-area (PPA) envelope. Sequential logic operates under a system clock that determines the system throughput, whereas combinational logic operates in a different power domain to control overall system power including dynamic and static power. The sequential logic and clock network may be implemented in one tier of the three-dimensional integrated circuit supplied with a relatively high power supply voltage, whereas the combinational logic may be implemented in another tier of the three-dimensional integrated circuit supplied with a relatively low power supply voltage. Further pipeline reorganization may be implemented to leverage the system energy consumption and performance to an optimal point.

26 Claims, 4 Drawing Sheets

(56) References Cited

U.S. PATENT DOCUMENTS

| 8,933,726 B2* | 1/2015 | Wang | H03K 3/0375 |
| | | | 326/68 |
| 2009/0243687 A1* | 10/2009 | Lewis | H03K 3/0375 |
| | | | 327/224 |
| 2010/0153759 A1 | 6/2010 | Singhal | |
| 2014/0210510 A1* | 7/2014 | Chromczak | G06F 1/10 |
| | | | 326/33 |
| 2015/0022262 A1 | 1/2015 | Du | |

OTHER PUBLICATIONS

Xie J., et al., "CPDI: Cross-power-domain interface circuit design in monolithic 3D technology", Quality Electronic Design (ISQED), 2013 14th International Symposium on, IEEE, Mar. 4, 2013 (Mar. 4, 2013), pp. 442-447, XP032418452, DOI: 10.1109/ISQED.2013. 6523649 ISBN: 978-1-4673-4951-2 Section II. "Monolithic 3D Technology"; figures 1,3.

* cited by examiner

DUAL POWER SWING PIPELINE DESIGN WITH SEPARATION OF COMBINATIONAL AND SEQUENTIAL LOGICS

FIELD OF DISCLOSURE

Various embodiments described herein relate to the design of integrated circuits, and more particularly, to the design of three-dimensional integrated circuits.

BACKGROUND

System-on-a-chip (SoC) integrated circuits which include digital, analog, power management or radio frequency (RF) circuit elements have been popular for mobile devices and other electronic devices that have stringent form factor requirements. More recently, three-dimensional integrated circuits (3D ICs) with multiple tiers of dies for placement of circuit elements are being designed for SoC implementations with further reduced chip footprints to allow mobile and other electronic devices to achieve even smaller form factors. In mobile applications and various other applications, it is also often desirable to operate such 3D IC chips with low power consumption which may be achievable by low-power circuit design. In theory, low-power design may be realized by lowering the dynamic power, that is, $C \cdot V^2 \cdot f$, where C is the capacitance, V is the voltage, and f is the frequency, as well as the static leakage power, that is, $I_{leak} \cdot V_{dd}$, where $I_{leak}$ is the leakage current and $V_{dd}$ is the power supply voltage. The dynamic power and the static leakage power may be reduced by reducing the power supply voltage $V_{dd}$. However, reducing the power supply voltage $V_{dd}$ results in reduced clock speed and degraded performance.

Various IC design techniques have been devised in attempts to improve the performance of low-power integrated circuits. Such design techniques include, for example, voltage boosting, deep pipeline, multiple threshold voltages (multi-Vt), and hardware parallelism. However, these design techniques often trade performance with other important metrics such as power and area footprint. For example, raising the power supply voltage $V_{dd}$ results in an increase in dynamic and leakage power but would contradict the principle of low-power circuit design. Moreover, in advanced technology nodes such as 22 nm or 14 nm nodes, for example, a high power supply voltage $V_{dd}$ is generally not available. Furthermore, many modern integrated circuits typically have large resistance-capacitance (RC) loads and generally do not respond well to voltage increases.

Deep pipelining by reducing the logic depth of the pipeline stage is often costly. Performance of circuits designed by using the deep pipelining technique may be hampered by sensitivity to clock skew at high frequencies and insertion delay at critical paths, in addition to power and area penalties due to the insertion of extra flops. Although the multi-Vt technique may alleviate some critical path issues, it may, however, result in increased technological complexity and fabrication cost. Hardware parallelism, on the other hand, may present considerable challenges in instruction coding due to the limit of Amdahl's Law and may incur area penalties.

SUMMARY

Exemplary embodiments of the disclosure are directed to apparatus and method for dual power swing pipeline design in three-dimensional integrated circuits with separation of combinational and sequential logics.

In an embodiment, a circuit is provided, the circuit comprising: a first sequential logic element having a logic input, a first power supply input operable to receive a first power supply voltage, and a logic output; a combinational logic element having a logic input coupled to the logic output of the first sequential logic element, a second power supply input operable to receive a second power supply voltage that is lower than the first power supply voltage, and a logic output; and a second sequential logic element having a logic input coupled to the logic output of the combinational logic element, a third power supply input operable to receive the first power supply voltage, and a logic output.

In another embodiment, a three-dimensional integrated circuit is provided, the three-dimensional integrated circuit comprising: a first tier of circuit elements, comprising: a first sequential logic element having a logic input, a first power supply input operable to receive a first power supply voltage, and a logic output; a second sequential logic element having a logic input, a second power supply input operable to receive the first power supply voltage, and a logic output; and a second tier of circuit elements, comprising: a combinational logic element having a logic input coupled to the logic output of the first sequential logic element, a third power supply input operable to receive a second power supply voltage that is lower than the first power supply voltage, and a logic output coupled to the logic input of the second sequential logic element.

In another embodiment, a method of operating a three-dimensional integrated circuit having a plurality of tiers is provided, the method comprising: supplying power at a first voltage to a first one of the tiers; supplying power at a second voltage to a second one of the tiers, wherein the second voltage is lower than the first voltage; shifting up a logic level from the second voltage to the first voltage for sequential logic elements in the first tier; and shifting down the logic level from the first voltage to the second voltage for combinational logic elements in the second tier.

In yet another embodiment, a three-dimensional integrated circuit having a plurality of tiers is provided, the three-dimensional integrated circuit comprising: means for supplying power at a first voltage to a first one of the tiers; means for supplying power at a second voltage to a second one of the tiers, wherein the second voltage is lower than the first voltage; means for shifting up a logic level from the second voltage to the first voltage for sequential logic elements in the first tier; and means for shifting down the logic level from the first voltage to the second voltage for combinational logic elements in the second tier.

BRIEF DESCRIPTION OF THE DRAWINGS

The accompanying drawings are presented to aid in the description of embodiments and are provided solely for illustration of the embodiments and not limitations thereof.

DETAILED DESCRIPTION

Aspects of the disclosure are described in the following description and related drawings directed to specific embodiments. Alternate embodiments may be devised without departing from the scope of the disclosure. Additionally, well-known elements will not be described in detail or will be omitted so as not to obscure the relevant details of the disclosure.

The word "exemplary" is used herein to mean "serving as an example, instance, or illustration." Any embodiment described herein as "exemplary" is not necessarily to be construed as preferred or advantageous over other embodiments. Likewise, the term "embodiments" does not require that all embodiments include the discussed feature, advantage or mode of operation.

The terminology used herein is for the purpose of describing particular embodiments only and is not intended to be limiting of the embodiments. As used herein, the singular forms "a," "an" and "the" are intended to include the plural forms as well, unless the context clearly indicates otherwise. It will be further understood that the terms "comprises," "comprising," "includes" or "including," when used herein, specify the presence of stated features, integers, steps, operations, elements, and/or components, but do not preclude the presence or addition of one or more other features, integers, steps, operations, elements, components, or groups thereof. Moreover, it is understood that the word "or" has the same meaning as the Boolean operator "OR," that is, it encompasses the possibilities of "either" and "both" and is not limited to "exclusive or" ("XOR"), unless expressly stated otherwise. It is also understood that the symbol "/" between two adjacent words has the same meaning as "or" unless expressly stated otherwise. Moreover, phrases such as "connected to," "coupled to" or "in communication with" are not limited to direct connections unless expressly stated otherwise.

In an embodiment, a three-dimensional integrated circuit is provided by using a dual or multiple power supply domain design in combination with deep pipeline for enhanced power-performance-area (PPA) envelope. In an embodiment, a logic pipeline design is provided that includes two separate power domains for sequential and combinational logic functions. In an embodiment, sequential logic is used to control system clock and throughput, whereas combinational logic is used to control overall system power, including dynamic and static power. In an embodiment, three-dimensional partitioning of tiers in a three-dimensional integrated circuit allows for efficient separation of power domains for sequential logic and for combinational logic. In a further embodiment, the tier on which the sequential logic is implemented is supplied with a relatively high power supply voltage ($V_{dd}$), whereas the tier on which the combinational logic is implemented is supplied with a relatively low power supply voltage ($V_{dd\_Low}$).

Figure 1:
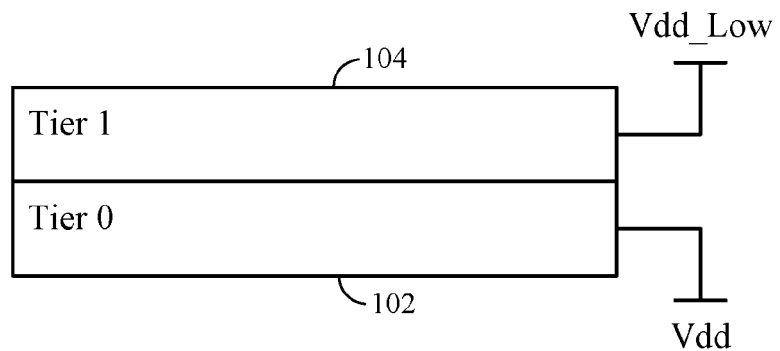
FIG. 1 is a simplified diagram showing an embodiment of a three-dimensional integrated circuit with two tiers.

FIG. 1 is a simplified diagram showing an embodiment of a three-dimensional integrated circuit with two tiers, including a lower tier 102 (Tier 0) and an upper tier 104 (Tier 1). In an embodiment, the lower tier 102 is supplied with a power supply voltage $V_{dd}$ whereas the upper tier 104 is supplied with another power supply voltage $V_{dd\_Low}$. In an embodiment, the power supply voltage $V_{dd\_Low}$ for the upper tier 104 is lower than the power supply voltage $V_{dd}$ for the lower tier 102. Although the three-dimensional integrated circuit in the example shown in FIG. 1 comprises two tiers, namely, Tier 0 and Tier 1, the principles of the disclosure may also be applicable to other three-dimensional integrated circuits with more than two tiers. For example, in a four-tier three-dimensional integrated circuit, a relatively high power supply voltage $V_{dd}$ may be applied to Tier 0, whereas a relatively low power supply voltage $V_{dd\_Low}$ may be applied to Tier 1.

Although in practical applications, it may be desirable to have a relatively high voltage $V_{dd}$ supplied to the bottom tier, or Tier 0, which is the tier of integrated circuits on the bottom die or substrate, it is not mandatory that the relatively high power supply voltage $V_{dd}$ be supplied to the bottom tier in all embodiments. Furthermore, while it may also be desirable in practical applications to have sequential logic supplied with a relatively high $V_{dd}$ in one tier and to have combinational logic supplied with a relatively low power supply voltage $V_{dd\_Low}$ in an adjacent tier, for example, a tier immediately above the bottom tier which implements the sequential logic, the tiers need not be adjacent to each other if the logic pipelines between the sequential logic and the combinational logic pass through one or more intermediate tiers in the physical design of the three-dimensional integrated circuit. Moreover, inter-tier connections between sequential logic having a relatively high power supply voltage $V_{dd}$ in one tier and combinational logic having a relatively low power supply voltage $V_{dd\_Low}$ in another tier along the logic pipeline may be realized by metal interconnects, pad contacts, inter-tier vias, or various other types of connections, for example.

Figure 2:
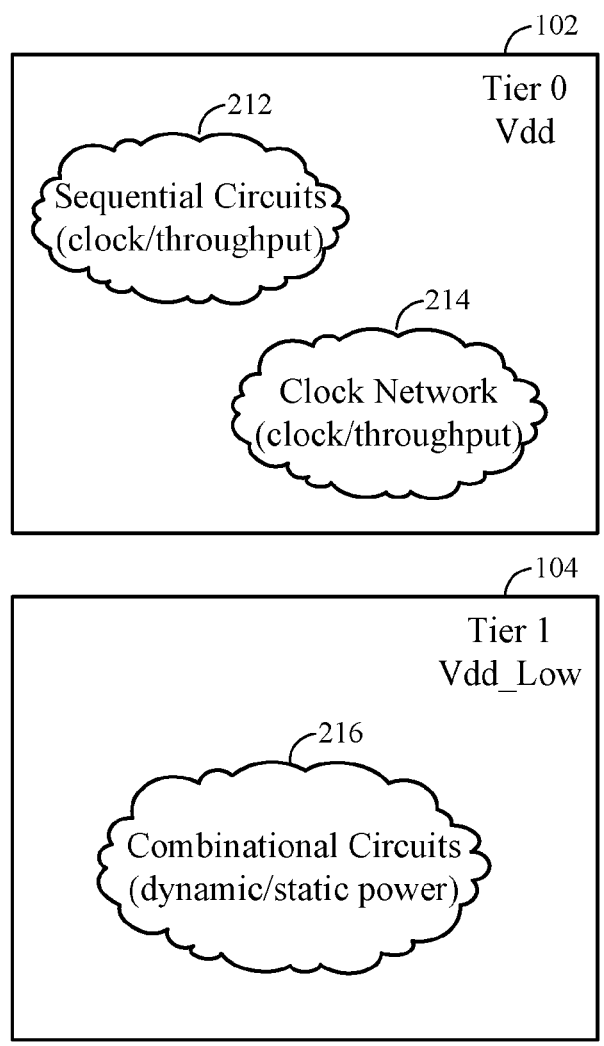
FIG. 2 is a simplified diagram showing an embodiment of a three-dimensional integrated circuit having a first tier which includes sequential circuits and a clock network supplied with a relatively high power supply voltage and a second tier which includes combinational circuits supplied with a relatively low power supply voltage.

FIG. 2 is a simplified diagram showing that Tier 0, which is supplied with a relatively high power supply voltage $V_{dd}$, includes sequential circuits 212 and a clock network 214, whereas Tier 1, which is supplied with a relatively low power supply voltage $V_{dd\_Low}$, includes combinational circuits 216. In an embodiment, the sequential circuits 212 in Tier 0 include sequential logic elements whereas the combinational circuits 216 in Tier 1 include combinational logic elements. In an embodiment, the clock network 214 and the sequential circuits 212 in Tier 0 control system clock and throughput whereas the combinational circuits 216 in Tier 1 control overall system power including dynamic and static power. In an embodiment, Tier 0 and Tier 1 may also include various types of additional circuit elements other than circuit elements for the sequential circuits 212, circuit elements for the clock network 214, and circuit elements for the combinational circuits 216 as illustrated in FIG. 2.

Figure 3A:
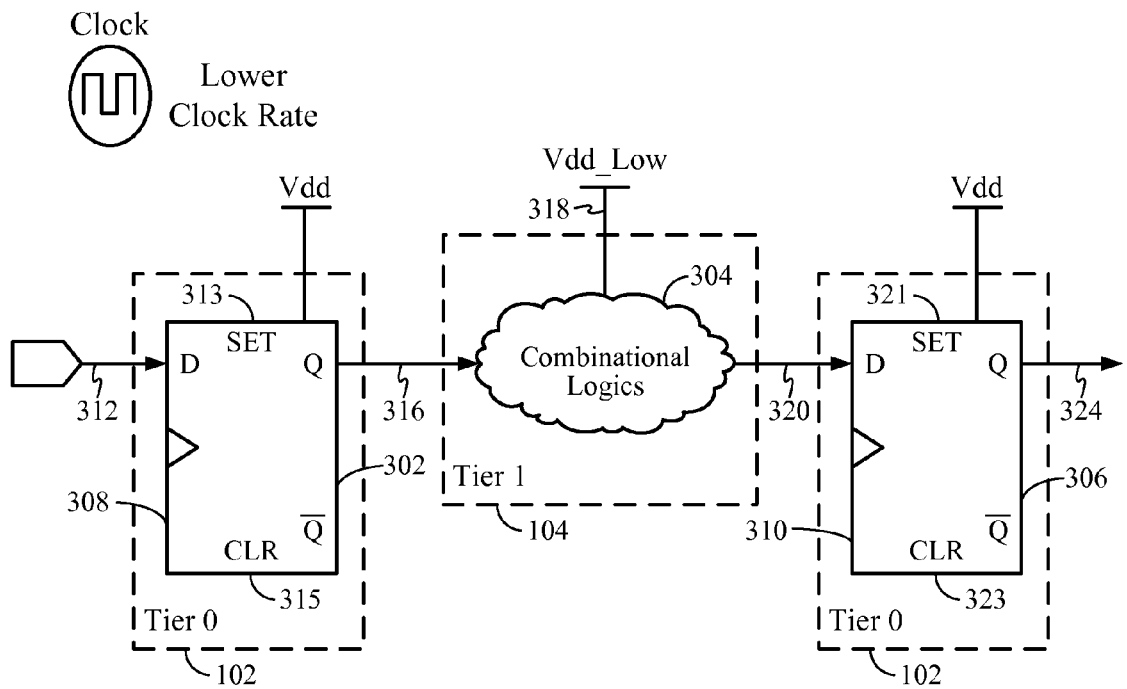
FIG. 3A is a circuit diagram illustrating an embodiment of a logic pipeline in a three-dimensional integrated circuit operating at a relatively low clock rate.

FIG. 3A is a circuit diagram illustrating an embodiment of a logic pipeline in a three-dimensional integrated circuit operating at a relatively low clock rate, for example, a clock rate of 700 MHz. In FIG. 3A, the logic pipeline includes a first sequential logic element 302 on Tier 0, a combinational logic element 304 on Tier 1, and a second sequential logic element on Tier 0. As described above, the first and second sequential logic elements 302 and 306 on Tier 0 are supplied with a first power supply voltage $V_{dd}$, whereas the combinational logic element 304 on Tier 1 is supplied with a second power supply voltage $V_{dd\_Low}$, which is lower than the first power supply voltage $V_{dd}$ for Tier 0. In an embodiment, the first sequential logic element 302 comprises a flip-flop, whereas the second sequential logic element 306 also comprises a flip-flop. In a further embodiment, the first sequential logic element 302 comprises a first D flip-flop 308, whereas the second sequential logic element 306 comprises a second D flip-flop 310, as shown in FIG. 3A.

In the embodiment shown in FIG. 3A, the first D flip-flop 308 has a D input 312 which is coupled to receive a logic input having an input logic voltage level, a SET pin 313, a CLR pin 315, and a Q output 316 for outputting a logic output in response to the input logic voltage level received at the D input 312 and the inputs at the SET and CLR pins. In the embodiment shown in FIG. 3A, the SET pin 313 of the first D flip-flop 308 is applied the voltage $V_{dd}$ to set the output Q value to logic 1, whereas the CLR pin 315 is used to clear or reset the output Q value to logic 0. The combinational logic element 304 on Tier 1 has a logic input coupled to the Q output 316 of the first D flip-flop 308 on Tier 0, and also a power supply input 318 coupled to receive the second power supply voltage $V_{dd\_Low}$, which is lower than the first power supply voltage $V_{dd}$.

In an embodiment, the second D flip-flop 310 on Tier 0 has a D input 320 coupled to the logic output of the combinational logic element 304 on Tier 1, a SET pin 321, a CLR pin 323, and a Q output 324 for outputting a logic output in response to the logic voltage level received from the combinational logic element 304 at the D input 320 and the inputs at the SET and CLR pins 321 and 323, respectively. In the embodiment shown in FIG. 3A, the SET pin 321 of the second D flip-flop 310 is applied the voltage $V_{dd}$ to set the output Q value to logic 1, whereas the CLR pin 323 is used to clear or reset the output Q value to logic 0. The logic operations of the first and second D flip-flops 308 and 310 will be described in further detail below with respect to FIGS. 4 and 5.

Figure 3B:
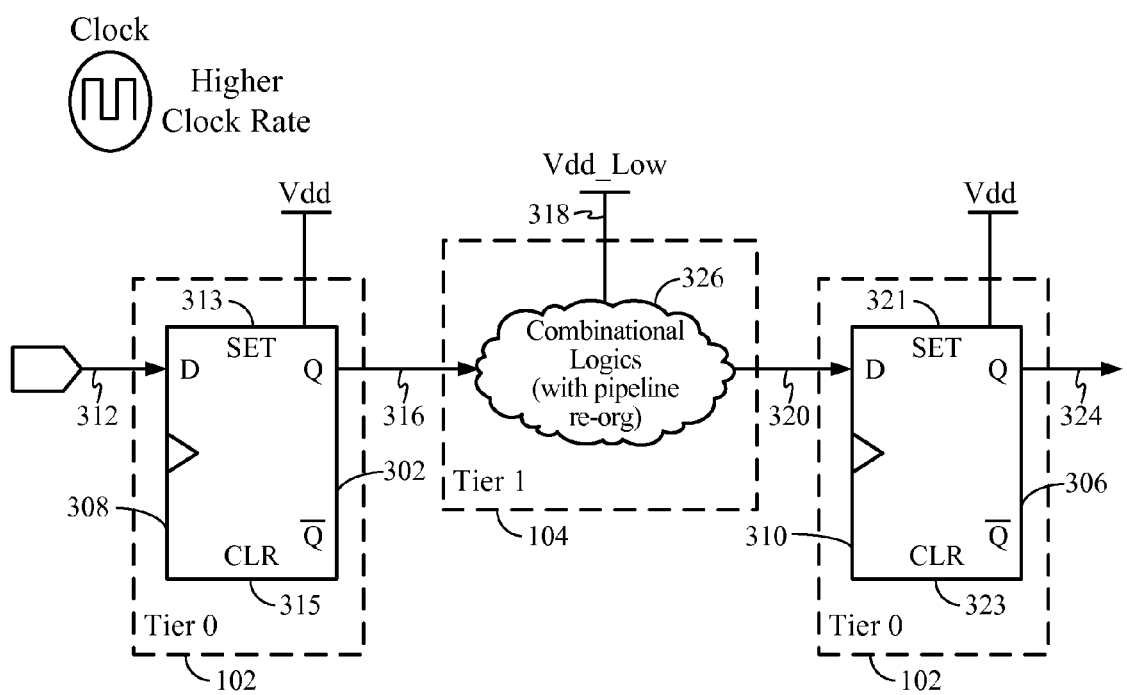
FIG. 3B is a circuit diagram illustrating an embodiment of a logic pipeline operating at a relatively high clock rate.

FIG. 3B is a circuit diagram illustrating an embodiment of the logic pipeline operating at a relatively high clock rate, for example, a clock rate of 1 GHz. In FIG. 3B, the first and second D flip-flops 308 and 310 operate in the same manner as the first and second D flip-flops 308 and 310 in FIG. 3A, respectively, except that the clock network 214 in Tier 0 (shown in FIG. 2) operates at a higher clock frequency. Referring to FIG. 3B, the first D flip-flop 308 has a D input 312 coupled to receive an input logic voltage level, a SET pin 313 coupled to receive the first power supply voltage $V_{dd}$, and a Q output 316 for outputting a logic output to the combinational logic element 326 on Tier 1. In the embodiment shown in FIG. 3B, the combinational logic element 326, which operates at a relatively low power supply voltage $V_{dd\_Low}$ but at a relatively high clock rate on Tier 1, has a reorganized pipeline compared to the combinational logic element 304 operating at a relatively low clock rate on Tier 1 as shown in FIG. 3A.

In the embodiment shown in FIG. 3B, the combinational logic element 326 with reorganized pipeline on Tier 1 has a logic input coupled to the Q output 316 of the first D flip-flop 308 on Tier 0, and also a power supply input 318 coupled to receive the second power supply voltage $V_{dd\_Low}$. In an embodiment, the second D flip-flop 310 on Tier 0 has a D input 320 coupled to the logic output of the combinational logic element 326 with reorganized pipeline on Tier 1, a SET input 322 which is coupled to receive the first power supply voltage $V_{dd}$, and a Q output 324 for outputting a logic output in response to the logic voltage level received from the combinational logic element 326 with reorganized pipeline at the D input 320 and the first power supply voltage $V_{dd}$ received at the SET input 322.

Figure 4:
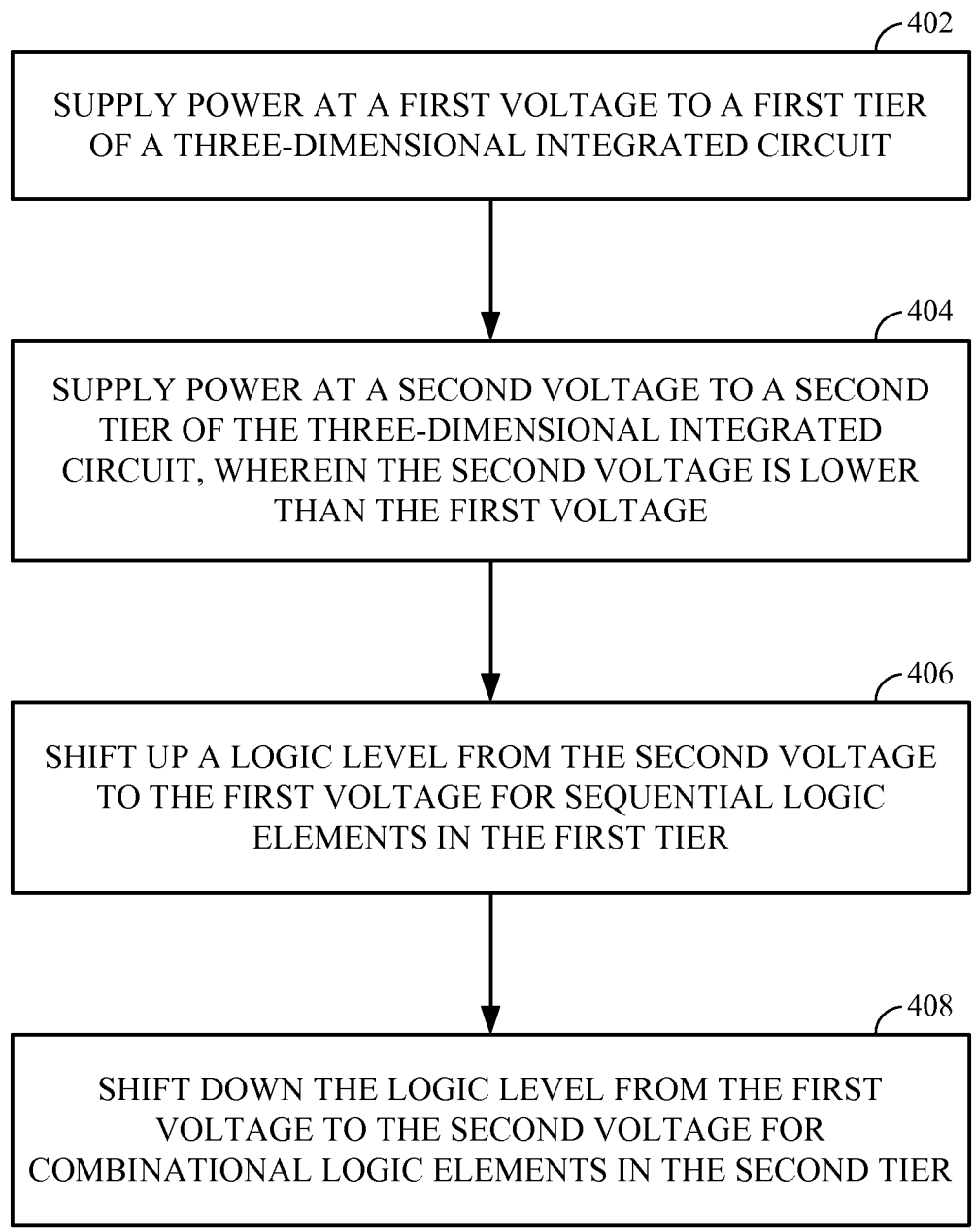
FIG. 4 is a flowchart illustrating an embodiment of a method of operating a three-dimensional integrated circuit having a plurality of tiers.

FIG. 4 is a flowchart illustrating an embodiment of a method of operating a three-dimensional integrated circuit having a plurality of tiers. A first power supply voltage is supplied to a first tier of the three-dimensional integrated circuit in step 402. In an embodiment, the first tier is the bottom tier or Tier 0 in a multi-tier three-dimensional integrated circuit, although the first tier may be any one of the tiers in alternate embodiments. Referring to FIG. 4, a second power supply voltage is supplied to a second tier of the three-dimensional integrated circuit in step 404. In an embodiment, the second power supply voltage supplied to the second tier in step 404 is a voltage lower than the first power supply voltage supplied to the first tier in step 402. In an embodiment, the second tier is the tier positioned immediately above the first tier in a multi-tier three-dimensional integrated circuit, although the second tier may be any one of the tiers other than the first tier in alternate embodiments.

Referring to FIG. 4, the logic voltage level for sequential logic elements in the first tier of the three-dimensional integrated circuit is shifted up in step 406. In step 408, the logic voltage level for combinational logic elements in the second tier of the three-dimensional integrated circuit is shifted down. In an embodiment, the logic voltage level for the sequential logic elements in the first tier is shifted up by using at least one flip-flop, such as a D flip-flop 308 or 310 in the first tier 102 (Tier 0), as shown in FIGS. 3A and 3B.

In an embodiment in which shifting up of the logic voltage level is performed by the first D flip-flop 308, for example, the power supply voltage $V_{dd}$ supplied to the SET input 313 of the first D flip-flop 308 shifts up a relatively low input logic voltage level, for example, $V_{dd\_Low}$ at the D input 312, to a relatively high output logic voltage level, for example, $V_{dd}$, at the Q output 316. Even if the input logic voltage at the D input 312 is already at a relatively high voltage level, for example, $V_{dd}$, the voltage $V_{dd}$ applied to the SET pin 313 ensures that the output logic voltage level at the Q output 316 of the first D flip-flop remains at $V_{dd}$. If, on the other hand, the relatively high power supply voltage $V_{dd}$ is no longer supplied to the SET pin 313 of the first D flip-flop 308, the output logic voltage level at the Q output 316 of the first D flip-flop is shifted down to the relatively low power supply voltage level $V_{dd\_Low}$.

Figure 5:
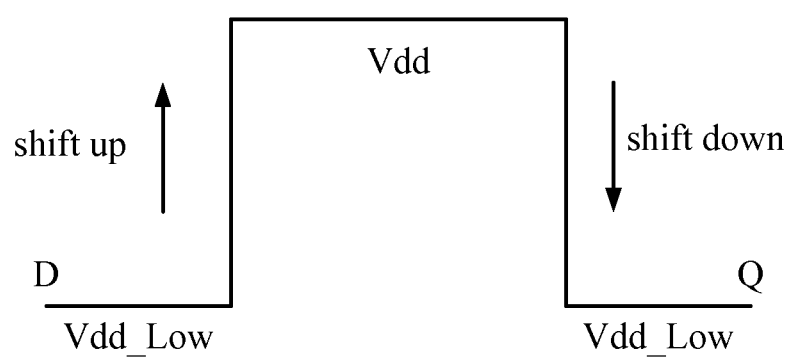
FIG. 5 is a diagram illustrating an example of upshifting and downshifting of the logic voltage level between a relatively low voltage level $V_{dd\_Low}$ and a relatively high voltage level $V_{dd}$ in response to the SET input of a D flip-flop.

In an embodiment, the second D flip-flop 310 has its D input 320 coupled to the combinational logic elements 304 in relatively low clock rate operations as shown in FIG. 3A or the combinational logic elements 326 with reorganized pipeline in relatively high clock rate operations as shown in FIG. 3B. In an embodiment, the second D flip-flop 310 operates in the same manner as the first D flip-flop 308 described above. The upshifting and downshifting of the logic voltage level between the relatively low voltage level $V_{dd\_Low}$ and the relatively high voltage level $V_{dd}$ in response to the SET input of each D flip-flop is illustrated in FIG. 5.

While the foregoing disclosure shows illustrative embodiments, it should be noted that various changes and modifications could be made herein without departing from the scope of the appended claims. The functions, steps or actions of the method claims in accordance with embodiments described herein need not be performed in any particular order unless expressly stated otherwise. Furthermore, although elements may be described or claimed in the singular, the plural is contemplated unless limitation to the singular is explicitly stated.

What is claimed is:

1. A circuit comprising:
  a first sequential logic element having a first sequential logic input, a first power supply input operable to receive a first power supply voltage, and a first sequential logic output;
  a combinational logic element having a combinational logic input coupled to the first sequential logic output of the first sequential logic element, a second power supply input operable to receive a second power supply voltage that is lower than the first power supply voltage, and a combinational logic output; and
  a second sequential logic element having a second sequential logic input coupled to the combinational logic output of the combinational logic element, a third power supply input operable to receive the first power supply voltage, and a second sequential logic output.

2. The circuit of claim 1,
  wherein the first sequential logic element and the second sequential logic element are disposed on a first tier of a three-dimensional integrated circuit, and
  wherein the combinational logic element is disposed on a second tier of the three-dimensional integrated circuit.

3. The circuit of claim 2,
  wherein the first power supply voltage is supplied to the first tier of the three-dimensional integrated circuit, and
  wherein the second power supply voltage is supplied to the second tier of the three-dimensional integrated circuit.

4. The circuit of claim 1, wherein the combinational logic element comprises a reorganized pipeline.

5. The circuit of claim 1, wherein the first and second sequential logic elements are operable based on a system clock that determines a throughput.

6. The circuit of claim 1,
  wherein the first and second sequential logic elements are operable based on the first power supply voltage, and
  wherein the combinational logic element is operable based on the second power supply voltage to reduce power consumption.

7. The circuit of claim 1, wherein the combinational logic element is operable to control overall system power.

8. The circuit of claim 1, wherein the combinational logic element is operable to control dynamic and static power.

9. The circuit of claim 1, wherein the first sequential logic element comprises a first flip-flop.

10. The circuit of claim 9, wherein the first flip-flop comprises a first D flip-flop.

11. The circuit of claim 1, wherein the second sequential logic element comprises a second flip-flop.

12. The circuit of claim 11, wherein the second flip-flop comprises a second D flip-flop.

13. A three-dimensional integrated circuit, comprising:
  a first tier of circuit elements, comprising:
    a first sequential logic element having a first sequential logic input, a first power supply input operable to receive a first power supply voltage, and a first sequential logic output;
    a second sequential logic element having a second sequential logic input, a second power supply input operable to receive the first power supply voltage, and a second sequential logic output; and
  a second tier of circuit elements, comprising:
    a combinational logic element having a combinational logic input coupled to the first sequential logic output of the first sequential logic element, a third power supply input operable to receive a second power supply voltage that is lower than the first power supply voltage, and a combinational logic output coupled to the second sequential logic input of the second sequential logic element.

14. The three-dimensional integrated circuit of claim 13, wherein the combinational logic element comprises a reorganized pipeline.

15. The three-dimensional integrated circuit of claim 13, wherein the first and second sequential logic elements are operable based on a system clock that determines a throughput.

16. The three-dimensional integrated circuit of claim 13,
  wherein the first and second sequential logic elements are operable based on the first power supply voltage, and
  wherein the combinational logic element is operable based on the second power supply voltage to reduce power consumption.

17. The three-dimensional integrated circuit of claim 13, wherein the combinational logic element is operable to control overall system power.

18. The three-dimensional integrated circuit of claim 13, wherein the combinational logic element is operable to control dynamic and static power.

19. The three-dimensional integrated circuit of claim 13, wherein the first sequential logic element comprises a first flip-flop.

20. The three-dimensional integrated circuit of claim 19, wherein the first flip-flop comprises a first D flip-flop.

21. The three-dimensional integrated circuit of claim 13, wherein the second sequential logic element comprises a second flip-flop.

22. The three-dimensional integrated circuit of claim 21, wherein the second flip-flop comprises a second D flip-flop.

23. A method of operating a three-dimensional integrated circuit having a plurality of tiers, the method comprising:
  supplying power at a first voltage to a first tier of the plurality of tiers;
  supplying power at a second voltage to a second tier of the plurality of tiers, wherein the second voltage is lower than the first voltage;
  shifting up a logic level from the second voltage to the first voltage for one or more sequential logic elements in the first tier;
  shifting down the logic level from the first voltage to the second voltage for one or more combinational logic elements in the second tier,
  wherein the first tier comprises a first flip-flop,
  wherein the shifting up the logic level from the second voltage to the first voltage for the sequential logic elements in the first tier is performed by the first flip-flop, and
  wherein the first flip-flop comprises a first D flip-flop comprising a first D input, a first set input operable to receive the first voltage, and a first Q output coupled to a combinational input of one of the one or more combinational logic elements in the second tier.

24. The method of claim 23, wherein the first tier further comprises a second D flip-flop comprising a second D input coupled to a combinational output of the one of the one or more combinational logic elements in the second tier, a second set input operable to receive the first voltage, and a second Q output.

25. A three-dimensional integrated circuit having a plurality of tiers, comprising:
  means for supplying power at a first voltage to a first tier of the plurality of tiers;

means for supplying power at a second voltage to a second tier of the plurality of tiers, wherein the second voltage is lower than the first voltage;

means for shifting up a logic level from the second voltage to the first voltage for one or more sequential logic elements in the first tier;

means for shifting down the logic level from the first voltage to the second voltage for one or more combinational logic elements in the second tier, wherein the means for shifting up the logic level from the second voltage to the first voltage for sequential logic elements in the first tier comprises a first flip-flop, and wherein the first flip-flop comprises a first D flip-flop comprising a D input, a first set input operable to receive the first voltage, and a first Q output coupled to a combinational input of one of the one or more combinational logic elements in the second tier.

26. The three-dimensional integrated circuit of claim 25, wherein the means for shifting up the logic level from the second voltage to the first voltage for sequential logic elements in the first tier further comprises a second D flip-flop comprising a second D input coupled to a combinational output of the one of the one or more combinational logic elements in the second tier, a second set input operable to receive the first voltage, and a second Q output.

* * * * *